United States Patent [19]
Inaba et al.

[11] Patent Number: 6,166,443
[45] Date of Patent: Dec. 26, 2000

[54] SEMICONDUCTOR DEVICE WITH REDUCED THICKNESS

[75] Inventors: Takehito Inaba; Michihiko Ichinose; Kenji Oyachi, all of Tokyo, Japan

[73] Assignee: NEC Corporation, Japan

[21] Appl. No.: 09/300,683

[22] Filed: Apr. 27, 1999

[30] Foreign Application Priority Data

Apr. 30, 1998 [JP] Japan .................................. 10-121046

[51] Int. Cl.[7] .......................... H01L 23/48; H01L 23/52; H01L 29/40; H01L 23/02

[52] U.S. Cl. .......................... 257/777; 257/778; 257/686; 257/781; 257/782; 257/786; 438/109; 438/108

[58] Field of Search ................................... 257/777, 778, 257/773, 781, 782, 786, 686; 438/108, 109

[56] References Cited

U.S. PATENT DOCUMENTS

| | | | |
|---|---|---|---|
| 5,715,144 | 2/1998 | Ameen et al. | 257/686 |
| 5,854,507 | 12/1998 | Miremadi et al. | 257/686 |
| 6,025,648 | 2/2000 | Takahashi et al. | 257/777 |
| 6,093,969 | 7/2000 | Lin | 257/777 |

FOREIGN PATENT DOCUMENTS

9-181256  7/1997  Japan .......................... H01L 25/065

*Primary Examiner*—Mahshid Saadat
*Assistant Examiner*—Jesse A Fenty
*Attorney, Agent, or Firm*—Hayes, Soloway, Hennessey, Grossman & Hage, P.C.

[57] ABSTRACT

Internal electrodes and external lead wiring lines are formed on the front surface of a substrate of a semiconductor device, and solder bumps electrically connected to the external lead wiring lines via through holes are provided on the rear surface of the substrate. A first semiconductor chip is mounted on the surface of the substrate, and a second semiconductor chip is mounted on the rear surface of the substrate. Electrodes of the first semiconductor chip are connected to bonding pads at one side ends of the internal wiring lines, and electrodes of the second semiconductor chip are connected to the bonding pads at the other ends of the internal wiring lines and the external lead wiring lines with bonding wires passing through openings provided in the substrate. The solder bumps are formed with a height equal to or greater than the thickness of the second semiconductor chip so that, when the semiconductor device is mounted on an external mounting board or the like, a gap is formed between the substrate of the semiconductor device and the external mounting board by the height of the solder bumps themselves. The second semiconductor chip mounted on the rear surface of the substrate is accommodated in the gap.

12 Claims, 7 Drawing Sheets

EXTERNAL MOUNTING BOARD

SEMICONDUCTOR DEVICE WITH REDUCED THICKNESS

BACKGROUND OF THE INVENTION

1. Field of the Invention

The present invention relates to a semiconductor device having a multi-chip module configuration and a method of manufacturing the same. More particularly, the present invention relates to a semiconductor device on which a logic chip and a memory chip are mounted, another semiconductor device on which a plurality of memory chips are mounted to assure a large memory capacity, or a further semiconductor device on which a plurality of semiconductor chips which are manufactured by different processes or are made of different materials are mounted and a method of manufacturing the semiconductor devices.

2. Description of the Related Art

Figure 1:
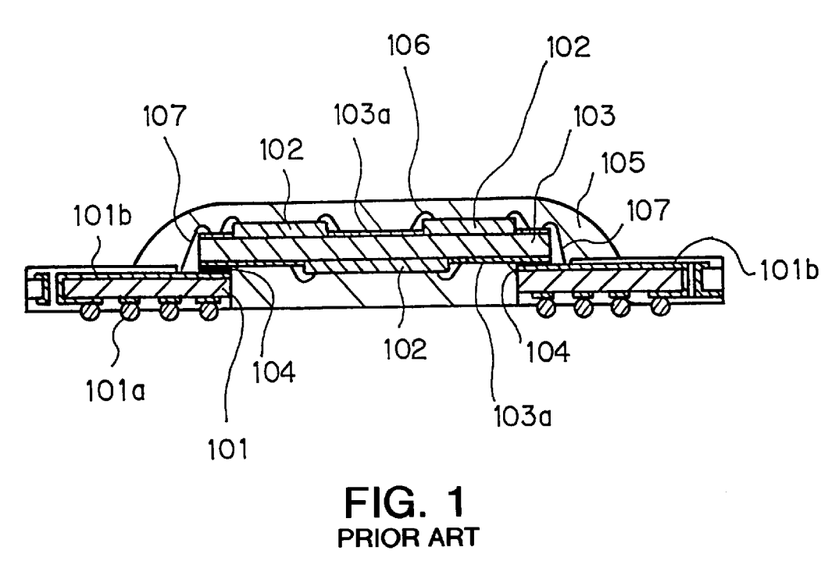
FIG. 1 is a sectional view of a conventional semiconductor device.

FIG. 1 is a sectional view showing a conventional semiconductor device disclosed in Japanese Patent Laid-Open No. 191256/1997. As shown in FIG. 1, in the conventional semiconductor device, a semiconductor element mounting board 103 having a plurality of semiconductor elements 102 mounted on the opposite surfaces thereof is supported on and electrically connected to external connection terminal supporting substrate 101 by solder 104. An external connection terminals 101a such as solder bumps are provided on the rear surface of external connection terminal supporting substrate 101. A semiconductor element mounting board 103 is encapsulated by an encapsulation resin 105.

Each semiconductor element 102 is connected to wiring patterns 103a formed on semiconductor element mounting board 103 by bonding wires 106. Further, wiring patterns 103a on semiconductor element mounting board 103 and wiring patterns 101b on external connection terminal supporting substrate 101 are connected to each other by bonding wires 107. Accordingly, each semiconductor element 102 and corresponding external connection terminals 101a are electrically connected to each other.

A process of mounting semiconductor elements 102 on semiconductor element mounting board 103 will be described.

First, semiconductor elements 102 are mounted on one of the surfaces of semiconductor element mounting board 103, and semiconductor element mounting board 103 and semiconductor elements 102 are connected to each other by wire bonding. Then, semiconductor element mounting board 103 is reversed. Then, semiconductor elements 102 are mounted on the other surface of semiconductor element mounting board 103, and semiconductor element mounting board 103 and semiconductor elements 102 are connected to each other by wire bonding. Thus, semiconductor elements 102 are mounted on the opposite surfaces of semiconductor element mounting board 103.

In the conventional semiconductor device, the use of the opposite surfaces of semiconductor element mounting board 103 as mounting surfaces for semiconductor elements 102 facilitates the mounting of a plurality of semiconductor elements 102 on semiconductor element mounting board 103. Further, in the conventional semiconductor, since electric connections are shared among external connection terminal supporting substrate 101 and semiconductor element mounting board 103, even when a plurality of semiconductor elements 102 of different kinds are mounted on semiconductor element mounting board 103, it is possible to use external connection terminal supporting substrate 101 and semiconductor element mounting board 103. This results in reduction of the manufacturing cost.

Figure 2:
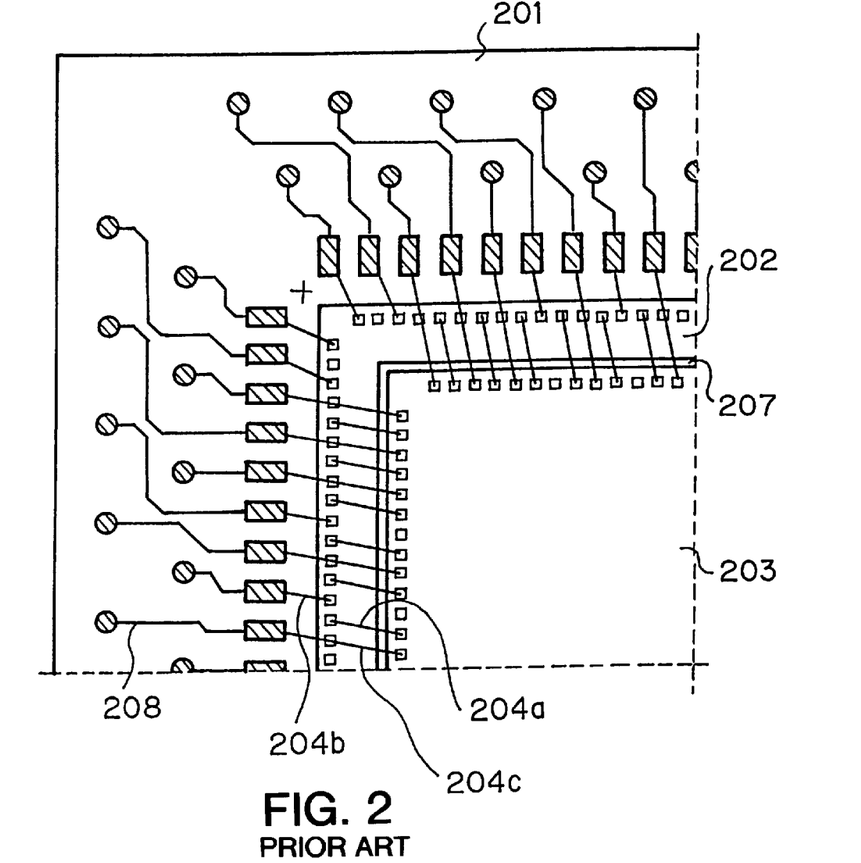
FIG. 2 is a partial plan view of another conventional semiconductor device.
Figure 3:
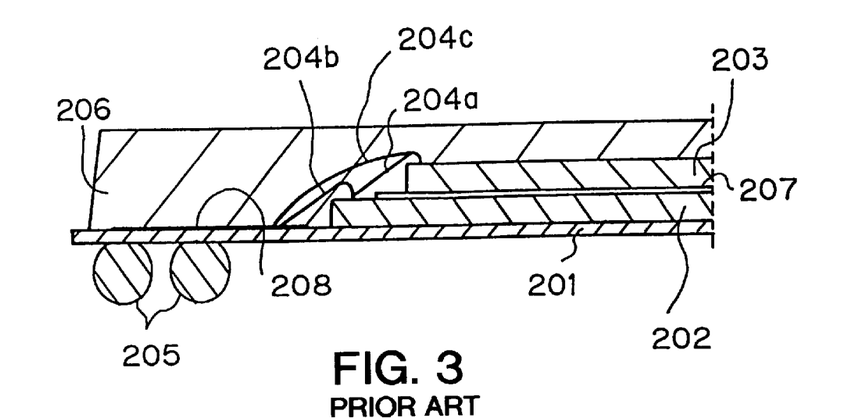
FIG. 3 is a sectional view of the semiconductor device of FIG. 2.

In another conventional semiconductor device shown in FIGS. 2 and 3, first semiconductor chip 202 is mounted on substrate 201 which has wiring patterns 208 formed on the front surface thereof. Further, a second semiconductor chip 203 is adhered to first semiconductor chip 202 by insulating adhesive tape 207 or the like. In this manner, the second conventional semiconductor device has a plurality of semiconductor chips mounted thereon, which is a so-called chip stack structure. Each semiconductor chip 202, 203 is mounted on substrate 201 such that the surface thereof on which bonding pads are formed is directed upwardly. Solder bumps 205 are provided on the rear surface of substrate 201 (see FIG. 3).

First semiconductor chip 202 and second semiconductor chip 203 are connected to each other by bonding wires 204a which connect bonding pads of the semiconductor chips to each other. Further, first semiconductor chip 202 and wiring patterns 208 of substrate 201 are connected to each other by bonding wires 204b, and second semiconductor chip 203 and wiring patterns 208 of substrate 201 are connected to each other by bonding wires 204c. Wiring patterns 208 formed on the front surface of substrate 201 and solder bumps 205 provided on the rear surface of substrate 201 are connected to each other via through holes (not shown). Thus, the electrical connection between semiconductor chips 202, 203 and solder bumps 205 is established. Further, the upper surface of substrate 201 is encapsulated with encapsulation resin 206 to provide hermetic seal with wiring patterns 208, semiconductor chips 202, 203 and each bonding wires.

A process of manufacturing the conventional semiconductor device shown in FIGS. 2 and 3 will be described.

First, conductive bonding agent such as silver paste is applied to the upper surface of substrate 201 to make first semiconductor chip 202 adhered to the upper surface of substrate 201. Then, insulating adhesive tape 207 is stuck on the upper surface of first semiconductor chip 202, and second semiconductor chip 203 is adhered to first semiconductor chip 202. Thereafter, substrate 201 on which semiconductor chips 202, 203 are mounted is baked. Then, bonding wires 204a, 204b, 204c are bonded to semiconductor chips 202, 203 and substrate 201 by a popular wire bonding method. Then, encapsulation resin 206 is poured onto the upper surface of substrate 201 to hermetically seal semiconductor chips 203, 203, wiring patterns 208, and the bonding wires. Finally, solder bumps 205 are joined to the through holes on the rear surface of substrate 201. Thus, the conventional semiconductor device is completed.

However, the conventional semiconductor device shown in FIG. 1 requires two substrates of external connection terminal supporting substrate 101 and semiconductor element mounting board 103 as a substrate on which semiconductor elements 102 are to be mounted. This in turn increases the number of components required for the semiconductor device, hindering reduction in the cost of the semiconductor device. Further, because of the construction that the semiconductor element mounting board 103 is supported on external connection terminal supporting substrate 101, the conventional semiconductor device has a thickness greater than the total thickness of at least two substrates, making it difficult to reduce the thickness of the package.

In addition, the process of mounting semiconductor elements 102 on semiconductor element mounting board 103 requires reversal of semiconductor element mounting board 103 after semiconductor elements 102 are mounted on one of the surfaces of semiconductor element mounting board 103, making the wire bonding process complicated. Further, there is a risk that short-circuiting between the wires may occur due to contact between them during the reversal of semiconductor element mounting board 103, as a result of a possible crush of bonding wires 106 connected already by a substrate transporting jig (not shown) of the mounting apparatus. This presents an obstacle to the improvement of yields and the quality of the semiconductor device.

Meanwhile, in the conventional semiconductor device described with reference to FIGS. 2 and 3, bonding wires 204b for connecting first semiconductor chip 202 and substrate 201 to each other are relatively long. Therefore, there arises a phenomenon that, when encapsulation resin 206 is poured onto substrate 201, bonding wires 204b are distorted to thereby cause mutual contact of adjacent bonding wires. Thus, there is a possibility that short-circuiting between wires may occur.

Since the conventional semiconductor device is of a construction that semiconductor chips 202, 203 are layered on single substrate 201, it has a reduced thickness as compared with the conventional semiconductor device shown in FIG. 1 which includes two substrates layered one on the other. However, in recent years, with the process of high density mounting, particularly in the fields of portable personal computers and portable telephone sets, there has been growing demands for decreasing the height of a semiconductor device during mounting.

SUMMARY OF THE INVENTION

It is an object of the present invention to provide a semiconductor device capable of further reduction in thickness during mounting and a method of manufacturing the semiconductor device.

It is another object of the present invention to provide a semiconductor device capable of improving of the reliability of electric connections and a method of manufacturing the semiconductor device.

According to one aspect of the present invention, a semiconductor device comprises external lead wiring lines formed on a front surface of a substrate and solder bumps electrically connected to the external lead wiring lines provided on a rear surface of the substrate. A first semiconductor chip has electrodes provided on one of surfaces thereof and mounted on the front surface of the substrate with the electrodes are connected to the external lead wiring lines. A second semiconductor chip has electrodes provided on one of surfaces thereof and mounted on the rear surface of the substrate with the electrodes are connected to the external lead wiring lines. The solder bumps are formed with a height equal to or greater than the thickness of the second semiconductor chip.

With this construction, when the semiconductor device is mounted on an external mounting board or the like, a gap is formed between the substrate of the semiconductor device and the external mounting board by the height of the solder bumps themselves, and the second semiconductor chip mounted on the rear surface of the substrate is accommodated in the gap. Consequently, the height of the semiconductor device when it is mounted is decreased by the thickness of the second semiconductor chip accommodated in the gap.

In one embodiment, the second semiconductor chip may be mounted on the rear surface of the substrate with the surface thereof on which the electrodes are provided is directed to the rear surface of the substrate. The substrate may have openings formed at portions thereof which face regions of the second semiconductor chip in which the electrodes are provided. The electrodes of the second semiconductor chip and the external lead wiring lines may be connected each other with bonding wires which pass through the openings. Consequently, a connecting process between the semiconductor chips mounted on the opposite surfaces of the substrate can be performed by a wire bonding process only for one surface of the substrate. This eliminates reversing the substrate in the connecting process for the semiconductor device, thus simplifying the wire bonding process and preventing such a trouble that bonding wires connected already may be crushed.

In further embodiment, the first semiconductor chip may be mounted on the front surface of the substrate with the surface thereof on which the electrodes connected to the external lead wiring lines are provided is directed to the front. Inner wiring lines may be formed on the front surface of the substrate so as to encircle the first semiconductor chip. The electrodes of the first semiconductor chip and one ends of the internal wiring lines may be connected to each other by bonding wires. The electrodes of the second semiconductor chip may be connected to the other ends of the internal wiring lines and the external lead wiring lines with bonding wires passing through the openings. Consequently, the bonding wires used for the individual connections can be made relatively short. Therefore, when encapsulation resin is poured onto the substrate, the possibility that the bonding wires may be distorted is reduced, and the yields and the quality of the semiconductor device can be improved.

In further embodiment, solder balls may be provided at the electrodes of the second semiconductor chip. Electrode pads electrically connected to the external lead wiring lines may be provided on the rear surface of the substrate. In addition, the second semiconductor chip may be bonded by flip chip bonding process to the rear surface of the substrate by the solder balls connecting to the electrode pads.

In further embodiment, a die pad may be provided on a portion of the front surface of the substrate on which the first semiconductor chip is mounted. In addition, the first semiconductor chip may be adhered to the die pad with conductive bonding agent.

In further embodiment, the second semiconductor chip may be adhered to the rear surface of the substrate by an adhesive tape.

In further embodiment, the substrate may be a rigid resin substrate or a flexible resin substrate.

According to another aspect of present invention, there is provided a method of manufacturing a semiconductor device. First, a first semiconductor chip, which has electrodes on one of surfaces thereof, is placed on a front surface of a substrate, which has external lead wiring lines formed on the front surface thereof, and electrodes of the first semiconductor chip are connected to the external lead wiring lines. Then, a second semiconductor chip, which has electrodes provided on one of surfaces thereof, is placed on a rear surface of the substrate and electrodes of the second semiconductor chip are connected to the external lead wiring lines. Then, solder bumps electrically connected to the external lead wiring lines and having a height equal to or greater than the thickness of the second semiconductor chip are provided on the rear surface of the substrate. Thus, a semiconductor device is manufactured wherein a gap in which the second semiconductor chip mounted on the rear surface of the substrate is accommodated is formed between the substrate of the semiconductor device and an external mounting board by the height of the solder bumps themselves, whereby the height of the semiconductor device when it is mounted is further reduced.

In one embodiment, a step of forming openings at portions of the substrate which face regions of the second semiconductor chip in which the electrodes are provided may be included. The step of placing a second semiconductor chip may include a step of placing the second semiconductor chip on the rear surface of the substrate with the surface thereof on which the electrodes are provided is directed to the rear surface of the substrate. The step of placing a second semiconductor chip may further include a step of connecting the electrodes of the second semiconductor chip and the external lead wiring lines with bonding wires passing through the openings. Consequently, the necessity for reversing the substrate in the wire bonding process for the semiconductor device is eliminated, and it is possible to simplify the wire bonding process and prevent such a trouble that the bonding wires connected already may be crushed.

In further embodiment, a step of forming openings at portions of the substrate which face regions of the second semiconductor chip in which the electrodes are provided and forming internal wiring lines on the front surface of the substrate so as to encircle the first semiconductor chip may be included. The step of placing a first semiconductor chip may include a step of placing the first semiconductor chip on the front surface of the substrate with the surface thereof on which the electrodes are provided is directed to the front, and a step of connecting the electrodes of the first semiconductor chip and one ends of the internal wiring lines each other with bonding wires. In addition, the step of placing a second semiconductor chip may include a step of placing the second semiconductor chip on the rear surface of the substrate with the surface thereof on which the electrodes are provided is directed to the rear surface of the substrate, and a step of connecting the electrodes of the second semiconductor chip and the external lead wiring lines with bonding wires passing through the openings. Further, a step of connecting the electrodes of the second semiconductor chip and the other ends of the internal wiring lines with bonding wires passing through the openings may be comprised. Consequently, the bonding wires used for the connections can be made relatively short, and when encapsulation resin is poured onto the substrate, the possibility that the bonding wires may be distorted is reduced. This improves the yields and the quality of the semiconductor device.

In further embodiment, a step of providing solder balls at the electrodes of the second semiconductor chip and providing electrode pads electrically connected to the external lead wiring lines on the rear surface of the substrate may be included. The step of placing a second semiconductor chip may comprise a step of bonding the second semiconductor chip to the rear surface of the substrate by flip chip bonding process by connecting the solder balls to the electrode pads.

The above and other objects, features and advantages of the present invention will become apparent from the following description with reference to the accompanying drawings which illustrate examples of the present invention.

BRIEF DESCRIPTION OF THE DRAWINGS

FIGS. 6A to 6F are sectional views illustrating a series of manufacturing processes the semiconductor device shown in FIGS. 4 and 5;

FIGS. 7A to 7F are plan views illustrating a series of manufacturing processes the semiconductor device shown in FIGS. 4 and 5;

DESCRIPTION OF THE PREFERRED EMBODIMENTS

First Embodiment

Figure 4:
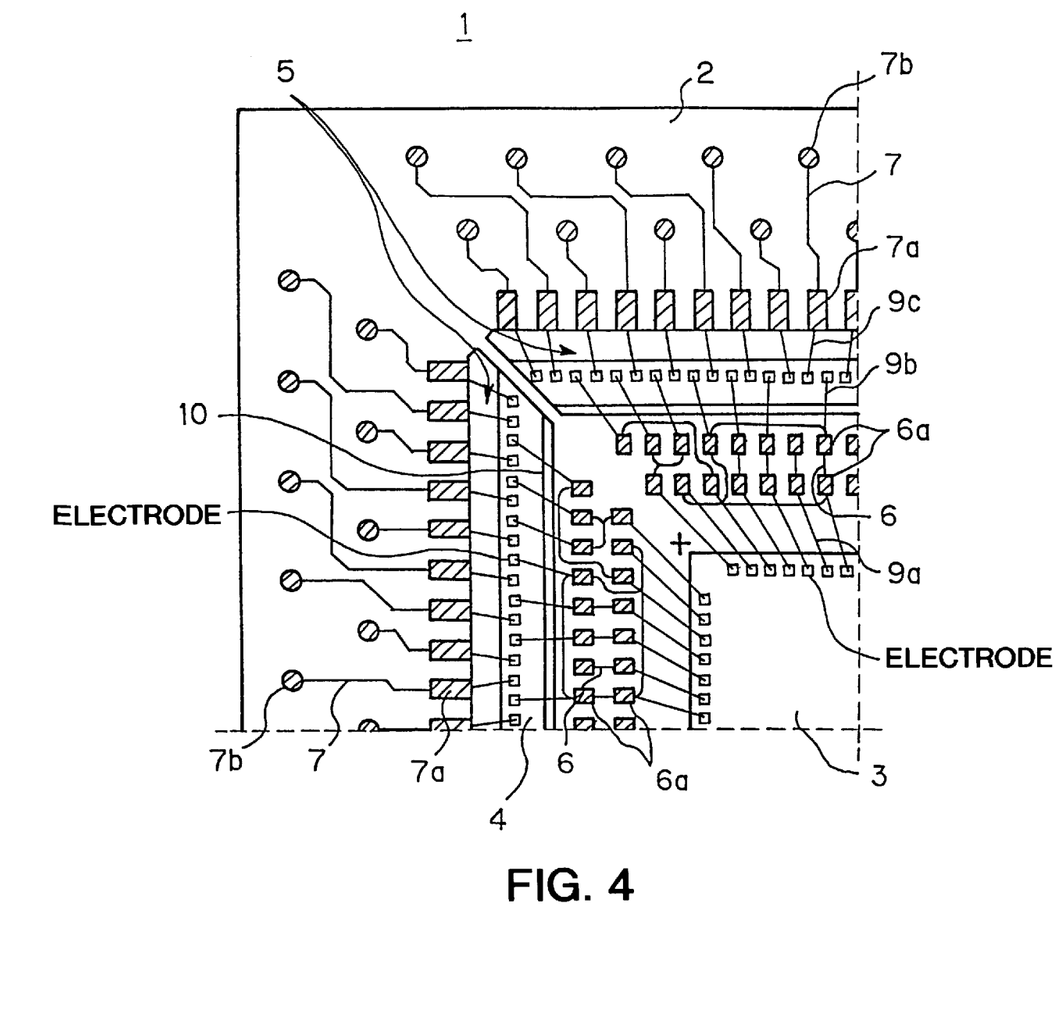
FIG. 4 is a partial plan view of a first embodiment according to a semiconductor device of the present invention.
Figure 5:
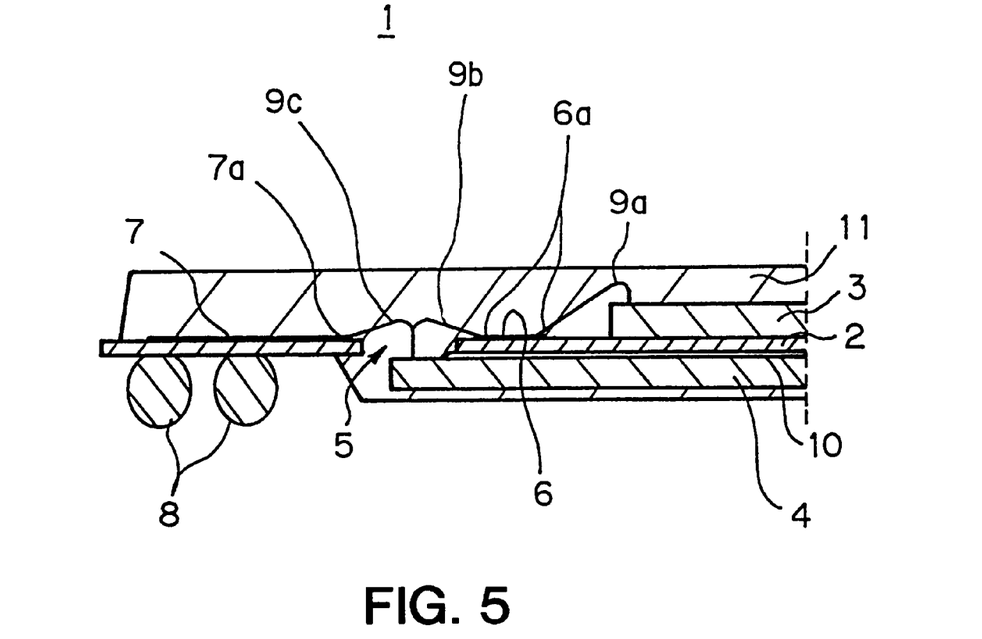
FIG. 5 is a sectional view of the semiconductor device shown in FIG. 4.

Referring to FIGS. 4 and 5, there is shown a semiconductor device according to a first embodiment of the present invention, generally designated 1. Semiconductor device 1 includes a first semiconductor chip 3 adhered to a die pad (not shown) provided on the front surface of a substrate 2 by conductive bonding agent such as silver paste, and a second semiconductor chip 4 adhered to the rear surface of substrate 2 by an adhesive tape 10 such as an LOC (Lead On Chip) tape. Each semiconductor chip 3, 4 is mounted on substrate 2 in such a way that a surface thereof on which electrodes are formed is directed upwards.

As shown in FIG. 4, an internal wiring lines 6 for the connection between first semiconductor chip 3 and second semiconductor chip 4 are formed on the front surface of substrate 2 so as to encircle first semiconductor chip 3 mounted on the die pad. Further, external lead wiring lines 7 for connecting internal circuits of semiconductor device 1 to an external mounting board or the like are formed on the front surface of substrate 2.

Bonding pads 6a are formed at the both ends of internal wiring lines 6. Further, bonding pad 7a is formed at one end of each external lead wiring line 7, and through hole 7b connected to the rear surface of substrate 2 is formed at the other end of each external lead wiring line 7. Furthermore, solder bump 8 having a height greater than at least the thickness of second semiconductor chip 4 is provided at each through hole 7b on the rear surface of substrate 2 (see FIG. 5).

As shown in FIGS. 4 and 5, substrates 2 has openings 5 formed at portions between internal wiring lines 6 and external lead wiring lines 7, which face regions of second semiconductor chip 4 in which the electrodes are provided.

The electrodes on first semiconductor chip 3 and bonding pads 6a at the one ends of internal wiring lines 6 are connected to each other by bonding wires 9a. Further, the electrodes on second semiconductor chip 4 and bonding pads 6a at the other ends of internal wiring lines 6 are connected to each other by bonding wires 9b passing through openings 5 of substrate 2, and the electrodes on second semiconductor chip 4 and external lead wiring lines 7 of substrate 2 are connected to each other by bonding wires 9c passing through openings 5 of substrate 2. Thus, first semiconductor chip 3 is connected to solder bumps 8 through internal wiring lines 6, second semiconductor chip 4, and external lead wiring lines 7, while second semiconductor chip 4 is connected to solder bumps 8 through external lead wiring lines 7.

As shown in FIG. 5, the front surface and the rear surface of substrate 2 are encapsulated by encapsulation resin 11 so that semiconductor chips 3, 4, wiring lines 6, 7, and bonding wires 9a, 9b, 9c may be hermetically sealed.

Next, a method of manufacturing semiconductor device 1 will be described below with reference to FIGS. 6A to 6F and 7A to 7F. FIGS. 6A to 6F are sectional views showing manufacturing processes of the semiconductor device shown in FIGS. 4 and 5, and FIGS. 7A to 7F are plan views showing a manufacturing processes of the semiconductor device shown in FIGS. 4 and 5.

Figure 6A:
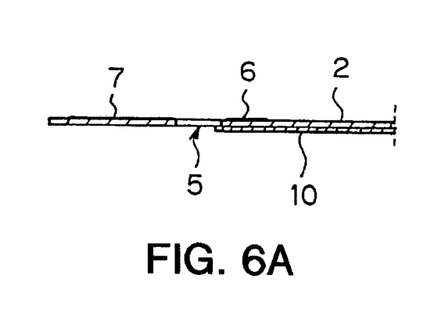
Figure 7A:
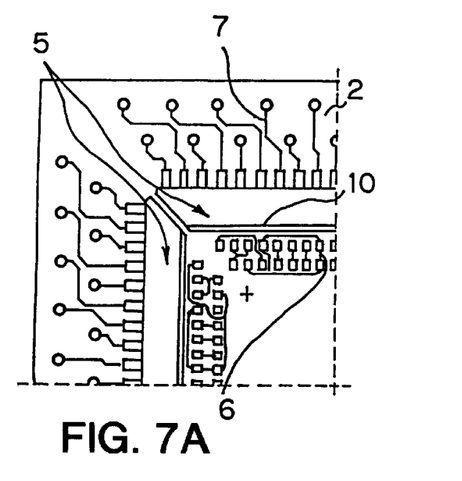

First, as shown in FIGS. 6A and 7A, internal wiring lines 6 and external lead wiring lines 7 are formed on the surface of substrate 2. Further, an adhesive tape 10 such as an LOC (Lead On Chip) tape or the like is stuck on the rear surface of substrate 2 having openings 5 formed therein between internal wiring lines 6 and external lead wiring lines 7 at a portion where second semiconductor chip 4 is to be mounted.

Figure 6B:
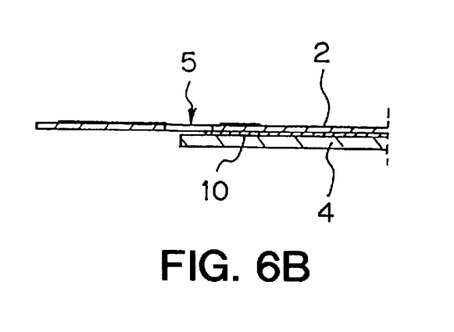
Figure 7B:
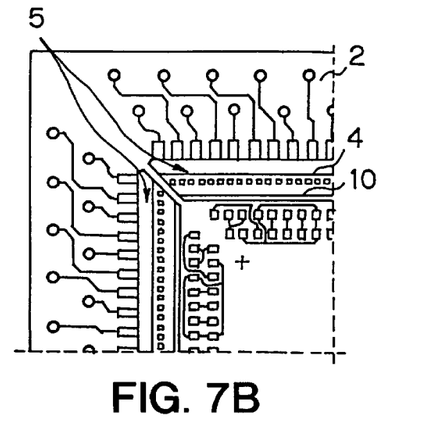

Then, as shown in FIGS. 6B and 7B, second semiconductor chip 4 is adhered to adhesive tape 10 stuck on the rear surface of substrate 2. At this time, positioning of second semiconductor chip 4 is performed with respect to substrate 2 in such a way that a region of second semiconductor chip 4 in which the electrode pads are provided may register against openings 5 in substrate 2.

Figure 6C:
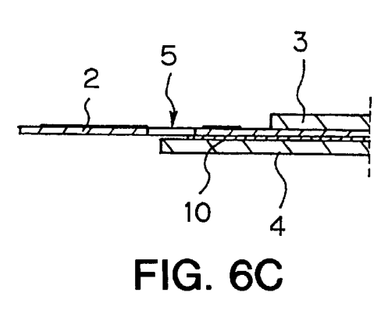
Figure 7C:
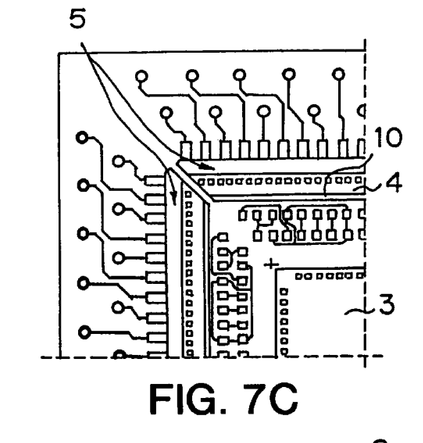

Then, conductive bonding agent (not shown) such as silver paste is applied to die pad (not shown) on the front surface of substrate 2. Thereafter, as shown in FIGS. 6C and 7C, first semiconductor chip 3 is adhered to the die pad on substrate 2 with the surface thereof, on which the electrode pads are provided, facing upwards. Then, a baking process is performed to harden the conductive bonding agent.

Figure 6D:
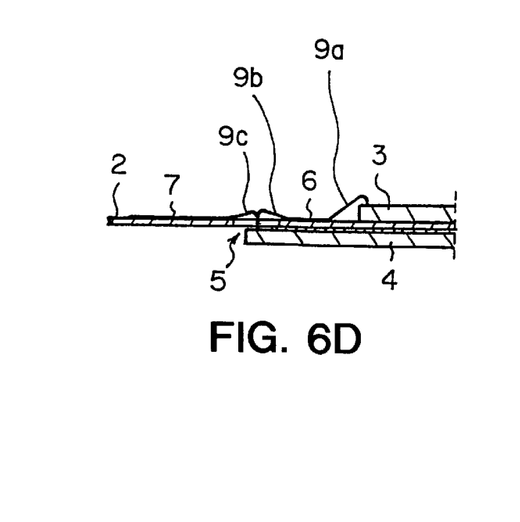
Figure 7D:
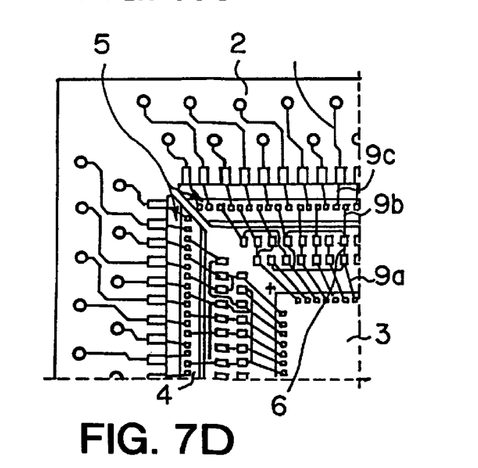

Then, as shown in FIGS. 6D and 7D, first semiconductor chip 3 and internal wiring lines 6 on substrate 2 are connected to each other by bonding wires 9a. Thereafter, second semiconductor chip 4 and internal wiring lines 6 on substrate 2 are connected to each other by bonding wires 9b, and second semiconductor chip 4 and external lead wiring lines 7 on substrate 2 are connected to each other by bonding wires 9c. At this time, bonding wires 9b, 9c are connected to second semiconductor chip 4 through openings 5 on substrate 2.

Figure 6E:
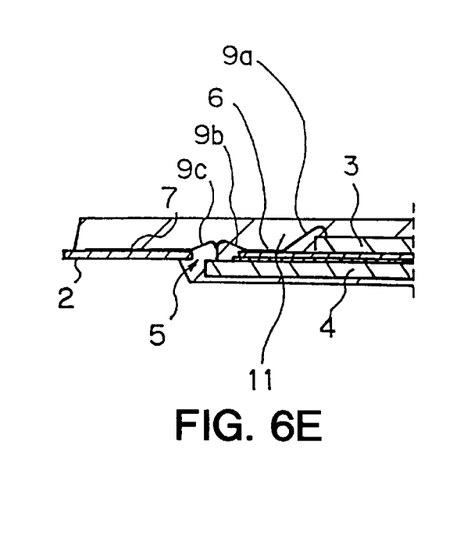
Figure 7E:
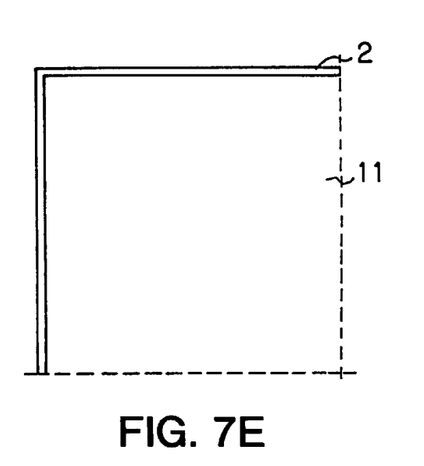

Then, as shown in FIGS. 6E and 7E, encapsulation resin 11 is poured onto the opposite surfaces of substrate 2 to hermetically seal semiconductor chips 3, 4, internal wiring lines 6, 7, and bonding wires 9a, 9b, 9c with encapsulation resin 11. Thereafter, encapsulation resin 11 is hardened.

Figure 6F:
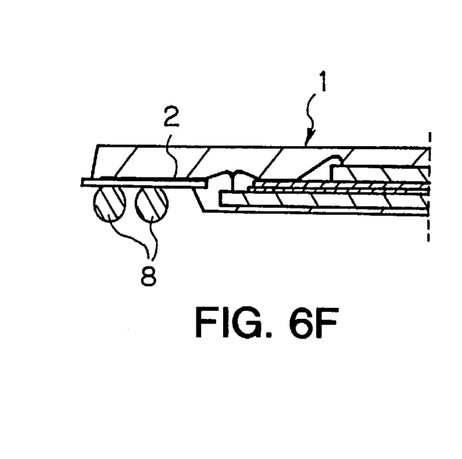
Figure 7F:
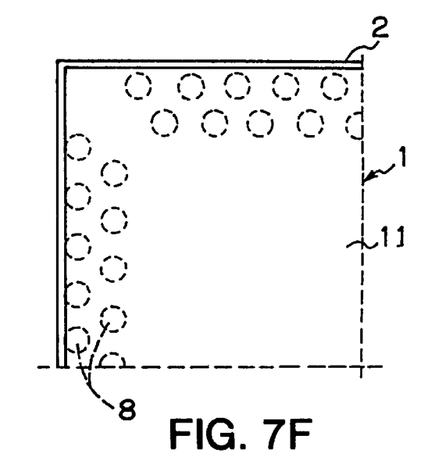
Figure 8:
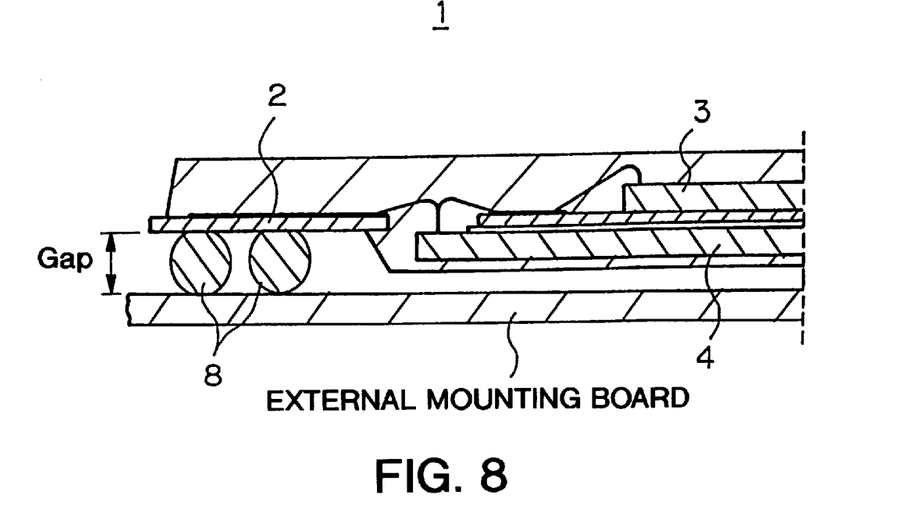
FIG. 8 is a sectional view showing the a state when semiconductor device shown in FIGS. 4 and 5 is mounted on an external mounting board.

Finally, as shown in FIGS. 6F and 7F, solder bumps 8 are formed at through holes 7b (see FIG. 4) formed at one end of external lead wiring lines 7 on the rear surface of substrate 2, with a height greater than the thickness of second semiconductor chip 4. Thus, semiconductor device 1 is completed by the above processes.

After semiconductor device 1 of the BGA (Ball Grid Array) type, having the aforementioned construction mounted on an external mounting board or the like solder bumps 8 causes a gap between substrate 2 of semiconductor device 1 and the external mounting board in which second semiconductor chip 4 mounted on the rear surface of substrate 2 is accommodated. With semiconductor device 1 according to the present embodiment, although the thickness of the package is same as that of the conventional semiconductor device of the chip stack type shown in FIG. 2, the height of semiconductor device 1 when it is mounted can be decreased by the gap in which second semiconductor chip 4 is accommodated.

Further, in semiconductor device 1 according to the present embodiment, although semiconductor chips are mounted on the opposite surfaces of substrate 2 similarly as in the conventional semiconductor device shown in FIG. 1, second semiconductor chip 4 mounted on the rear surface side of substrate 2 and wiring lines 6, 7 on the front surface of substrate 2 are connected to each other by bonding wires 9b, 9c passing through openings 5 of substrate 2. Therefore, wire bonding of the semiconductor chips mounted on the opposite surfaces of the substrate can be performed by a bonding processes for only one surface, thus eliminating the need of reversing substrate 2 in the wiring bonding processes of semiconductor device 1. This simplifies wire bonding processes and prevents such a trouble that bonding wires connected already may be crushed.

Further, in semiconductor device 1 of the present embodiment, since first semiconductor chip 3 is connected to external lead wiring lines 7 through internal wiring lines 6 and second semiconductor chip 4, the bonding wires used for the connections can be made relatively short. This decreases a risk that the bonding wires may cause distortion of the wires when encapsulation resin 11 is poured onto substrate 2, thereby improving yields and the quality of semiconductor device 1.

Substrate 2 used in the present embodiment may be a resin substrate of a so-called rigid type or may be a resin substrate of a so-called flexible type.

Further, semiconductor chips 3, 4 may be logic chips or memory chips, or else may be chips whose materials or manufacturing processes are different from each other. Further, a plurality of semiconductor chips 3, 4 may be mounted on substrate 2.

Second Embodiment

Figure 9:
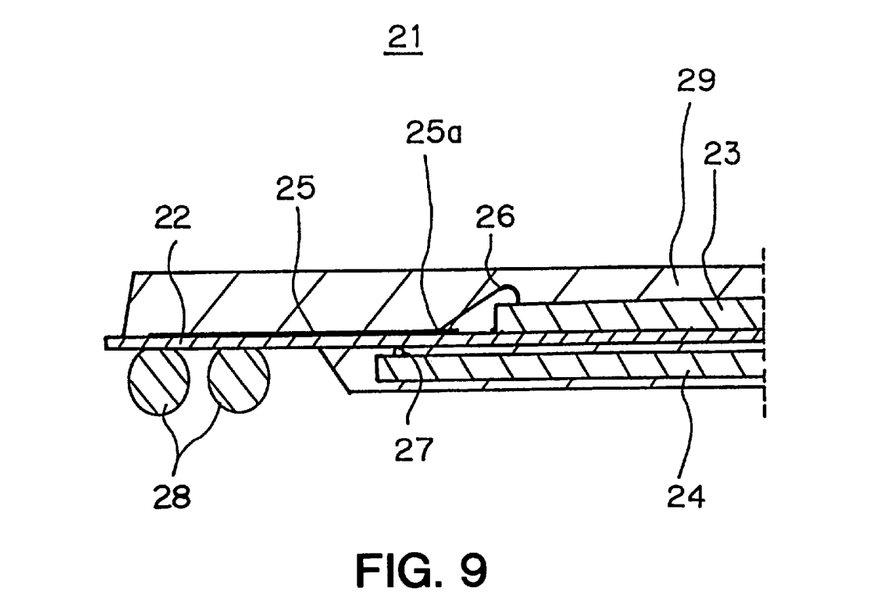
FIG. 9 is a partial sectional view showing a second embodiment according to the semiconductor device of the present invention.

Referring to FIG. 9, there is shown a semiconductor device 21 according to a second embodiment of the present invention. Semiconductor device 21 includes a first semiconductor chip 23 adhered to a die pad (not shown) provided on the front surface of substrate 22 with conductive bonding agent such as silver paste, and a second semiconductor chip 24 which is flip chip bonded to electrode pads (not shown) provided on the rear surface of substrate 22 through solder balls 27 provided at electrodes of second semiconductor chip 24. First semiconductor chip 23 is mounted on substrate 22 such that the surface thereof on which electrodes are provided is directed upwards.

Wiring lines 25 for connecting internal circuits of semiconductor device 21 to an external mounting board or the like are provided on the front surface of substrate 22. Bonding pads 25a are formed at one end of wiring lines 25 so as to encircle a first semiconductor chip 23 mounted on the die pad, and first through holes (not shown) connected to the rear surface of substrate 22 are formed at the other ends of wiring lines 25. Solder bumps 28 having a height greater than the thickness of second semiconductor chip 24 are joined to the through holes on the rear surface of substrate 22. Further, wiring lines 25 provided on the front surface of substrate 22 and the electrode pads provided on the rear surface of substrate 22 are connected to each other through second through holes (not shown).

The electrodes on first semiconductor chip 23 and bonding pads 25a on wiring lines 25 are connected to each other by bonding wires 26. Second semiconductor chip 24 and wiring lines 25 are connected to each other through the second through holes. Thus, semiconductor chips 23, 24 are connected to solder bumps 28 by wiring lines 25. Furthermore, the front surface and the rear surface of substrate 22 are encapsulated with encapsulation resin 29 so that semiconductor chips 23, 24, wiring lines 25, and bonding wires 26 may be hermetically sealed.

Next, a method of manufacturing semiconductor device 21 will be described below.

First, conductive bonding agent (not shown) such as silver paste is applied to the die pad (not shown) on the surface of substrate 22. First semiconductor chip 23 is then adhered to the die pad on substrate 22 such that the surface thereof on which the electrodes are provided faces upwards. Then, a baking process is performed to harden the conductive bonding agent.

Then, positioning is performed between the electrode pads provided on the rear surface of substrate 22 and solder balls 27 at the electrodes of second semiconductor chip 24, and solder balls 27 are reflowed to flip chip bond second semiconductor chip 24 to the rear surface of substrate 22.

Then, first semiconductor chip 23 and wiring lines 25 are connected to each other by bonding wires 26. Thereafter, encapsulation resin 29 is poured onto the opposite surfaces of substrate 22 to hermetically seal semiconductor chips 23, 24, wiring lines 25, and bonding wires 26 with encapsulation resin 29, which is followed by hardening of encapsulation resin 29.

Finally, solder bumps 28 are formed at the first through holes formed at one ends of wiring lines 25 such that they have a height equal to or greater than the thickness of second semiconductor chip 24. Thus, semiconductor device 21 has been completed.

Also in semiconductor device 21 according to the present embodiment, similarly as in semiconductor device 1 of the first embodiment shown in FIG. 5 and so forth, after it is mounted on an external mounting board or the like, a gap is formed between substrate 22 and the external mounting board by the height of solder bumps 28 themselves, and the second semiconductor chip 24 mounted on the rear surface of substrate 22 is accommodated in the gap. Consequently, the height of semiconductor device 1 when it is mounted can be decreased by the height of second semiconductor chip 24 is accommodated in the gap.

Further, in semiconductor device 21 of the present embodiment, since second semiconductor chip 24 is mounted on the rear surface of substrate 22 by flip chip bonding process, a wire bonding process is performed only for the connections between first semiconductor chip 23 and wiring lines 25. Accordingly, the wire bonding process is performed only for one surface of substrate 22, thereby eliminating the need of reversing substrate 22 in the wire bonding process of semiconductor device 21. This simplifies the wire bonding process and prevents such a trouble that bonding wires connected already may be crushed.

Furthermore, as discussed above, bonding pads 25a of wiring lines 25 are formed in such a manner as to encircle first semiconductor chip 23 mounted on the die pad, bonding pads 25a on wiring lines 25 and the electrodes on first semiconductor chip 23 mounted on the die pad are disposed adjacent each other. Accordingly, since the bonding wires used for connection between first semiconductor chip 23 and wiring lines 25 can be made relatively short. This decreases a risk that the bonding wires may cause distortion of the wires when encapsulation resin 29 is poured onto substrate 22, thereby improving yields and the quality of semiconductor device 21.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:
   a substrate having external lead wiring lines formed on its front surface and having solder bumps on its rear surface, said solder bumps being electrically connected to said external lead wiring lines;
   a first semiconductor chip having electrodes on one of surfaces thereof and mounted on the front surface of said substrate with said electrodes being connected to said external lead wiring lines; and
   a second semiconductor chip having electrodes on one of surfaces thereof and mounted on the rear surface of said substrate with said electrodes being connected to said external lead wiring lines;
   said solder bumps having a height equal to or greater than the thickness of said second semiconductor chip.

2. A semiconductor device according to claim 1, wherein said second semiconductor chip is mounted on the rear surface of said substrate with the surface thereof on which said electrodes are formed being directed to the rear surface of said substrate, said substrate has openings formed at portions thereof facing regions of said second semiconductor chip in which said electrodes are formed, and said electrodes of said second semiconductor chip and said external lead wiring lines are connected to each other by bonding wires passing through said openings.

3. A semiconductor device according to claim 2, wherein said first semiconductor chip is mounted on the front surface of said substrate with the surface thereof on which said electrodes to be connected to said external lead wiring lines are provided serving as a front surface, and internal wiring lines are formed on the front surface of said substrate in such a manner as to encircle said first semiconductor chip, and said electrodes of said first semiconductor chip and one-side ends of said internal wiring lines are connected to each other by bonding wires, while said electrodes of said second semiconductor chip are connected to the other ends of said internal wiring lines and said external lead wiring lines by bonding wires passing through said openings.

4. A semiconductor device according to claim 1, wherein solder balls are provided at said electrodes of said second semiconductor chip, electrode pads electrically connected to said external lead wiring lines are provided on the rear surface of said substrate, and said second semiconductor chip is bonded by flip chip bonding process to the rear surface of said substrate by the connection of said solder balls to said electrode pads.

5. A semiconductor device according to claim 1, wherein a die pad is provided on the front surface of said substrate on which said first semiconductor chip is mounted, and said first semiconductor chip is adhered to said die pad with conductive bonding agent.

6. A semiconductor device according to claim 1, wherein said second semiconductor chip is adhered to the rear surface of said substrate by an adhesive tape.

7. A semiconductor device according to claim 1, wherein said substrate is a rigid resin substrate.

8. A semiconductor device according to claim 1, wherein said substrate is a flexible resin substrate.

9. A method of manufacturing a semiconductor device, comprising the steps of:

placing a first semiconductor chip, which has electrodes on one of surfaces thereof, on a front surface of a substrate, which has external lead wiring lines formed on the front surface thereof, and connecting electrodes of said first semiconductor chip to said external lead wiring lines;

placing a second semiconductor chip, which has electrodes on one of surfaces thereof, on a rear surface of said substrate, and connecting electrodes of said second semiconductor chip to said external lead wiring lines; and providing, on the rear surface of said substrate, solder bumps electrically connected to said external lead wiring lines and having a height equal to or greater than the thickness of said second semiconductor chip.

10. A method of manufacturing a semiconductor device according to claim 9, further comprising the steps of forming openings at portions of said substrate which face regions of said second semiconductor chip in which said electrodes are provided, wherein said step of placing a second semiconductor chip includes the step of placing said second semiconductor chip on the rear surface of said substrate with the surface thereof on which said electrodes are provided being directed to the rear surface of said substrate, and connecting said electrodes of said second semiconductor chip to said external lead wiring lines by bonding wires passing through said openings.

11. A method of manufacturing a semiconductor device according to claim 9, further comprising the steps of forming openings at portions of said substrate which face regions of said second semiconductor chip in which said electrodes are provided, and forming internal wiring lines on the front surface of said substrate so as to encircle said first semiconductor chip, wherein said step of placing a first semiconductor chip includes the steps of placing said first semiconductor chip on the front surface of said substrate with the surface thereof on which said electrodes are provided serving as a front surface, and connecting said electrodes of said first semiconductor chip to one ends of said internal wiring lines by bonding wires, said step of placing a second semiconductor chip includes the steps of placing said second semiconductor chip on the rear surface of said substrate with the surface thereof on which said electrodes are provided being directed to the rear surface of said substrate, and connecting said electrodes of said second semiconductor chip to said external lead wiring lines by bonding wires passing through said openings, and further comprising a step of connecting said electrodes of said second semiconductor chip to the other ends of said internal wiring lines by bonding wires passing through said openings.

12. A method of manufacturing a semiconductor device according to claim 9, further comprising the steps of providing solder balls at said electrodes of said second semiconductor chip and providing electrode pads electrically connected to said external lead wiring lines on the rear surface of said substrate, wherein said step of placing a second semiconductor chip comprises a step of bonding said second semiconductor chip to the rear surface of said substrate by flip chip bonding process by connecting said solder balls to said electrode pads.

* * * * *